United States Patent [19]

Schumacher et al.

[11] Patent Number: 5,381,306

[45] Date of Patent: Jan. 10, 1995

[54] METHOD AND APPARATUS FOR DELIVERING POWER USING A MULTIPLANE POWER VIA MATRIX

[75] Inventors: Richard A. Schumacher, Dallas; James R. Day, Plano, both of Tex.

[73] Assignee: Convex Computer Corporation, Richardson, Tex.

[21] Appl. No.: 109,650

[22] Filed: Aug. 20, 1993

[51] Int. Cl.⁶ ............................ H05K 1/11; H01K 3/10
[52] U.S. Cl. ................................ 361/792; 361/765; 174/261; 174/264; 174/266; 29/850
[58] Field of Search .......... 361/792, 793, 794, 795, 361/760–761, 763, 765, 772, 777, 778, 784, 785; 174/262, 263, 264, 265, 266, 250, 255, 260, 26, 29; 29/829, 830–832, 850, 852

[56] References Cited

U.S. PATENT DOCUMENTS

| | | | |
|---|---|---|---|
| 3,566,005 | 2/1971 | Shaheen | 361/795 |
| 3,680,005 | 7/1972 | Jorgensen et al. | 361/795 |
| 4,543,715 | 10/1985 | Iadarola et al. | 174/261 |
| 4,560,962 | 12/1985 | Barrow . | |
| 4,928,061 | 5/1990 | Dampier et al. . | |
| 5,199,163 | 4/1993 | Ehrenberg et al. . | |

*Primary Examiner*—Bot Ledynh
*Attorney, Agent, or Firm*—Winstead Sechrest & Minick

[57] ABSTRACT

Disclosed is an apparatus and method for delivering power utilizing a multiplane power via matrix wherein the vias are each interconnected on each of the planes through which they pass such that a current flowing along any particular via, or via group, is free to either continue along its current path, or to move across any of the planes as a function of least resistance. The invention provides a system of vias for transferring power from any particular first plane to any desired second plane.

9 Claims, 2 Drawing Sheets

METHOD AND APPARATUS FOR DELIVERING POWER USING A MULTIPLANE POWER VIA MATRIX

TECHNICAL FIELD OF THE INVENTION

This invention relates to a printed circuit power distribution method and system and more particularly to the use of a multiplane power matrix interconnected on many levels by a group of electrically conductive vias.

BACKGROUND OF THE INVENTION

Most electronic devices today incorporate one or more printed wiring boards into their design. These printed wiring boards have become very sophisticated, having multilevels with each level employing connections on each side thereof. The electronic devices, such as computers, are themselves becoming more and more complex and sophisticated.

As the sophistication increases, so does the need for power and power distribution systems. It is now necessary to transport power levels in the order of 100 amps or more between different layers of the multilayer printed wiring board.

In a typical situation, a power device is plugged into a top layer of the circuit board, and current from the device must be delivered to a mid-level layer, or plane. Thus, the current must flow from the top layer, through all intermediate layers, to the desired layer.

In the prior art, this distribution of power between layers has been accomplished using power vias, or current conducting channels, fashioned in the printed wiring board. The vias would be insulated from each layer as it passed through that layer and would be connected electrically only to the layer to, or from, which the power transfer was to occur. In some arrangements, a metal socket would extend from the surface to the desired power plane for the purpose of conducting power from the power device, commonly called a power brick.

The amperage capacity of a power brick having the dimensions of 2½ by 4½ inches has increased from 30 amps to over 100 amps and the vias of the prior art are not capable of transferring that much power due, in part, to the fact that the resistance of the vias caused heat build up resulting in both component and board failures, as well as fire hazards.

Therefore, one object of the present invention is to decrease electrical resistance by increasing the surface contact of the metallized surfaces in order to transfer more current.

Another object of the present invention is to provide low impedance and low inductance to the circuit.

A further object of the present invention is to enable a cost-effective and reliable multiplane printed circuit board connection to high amperage electric power devices.

A still further object is to accomplish the desired result using existing printing wiring board construction techniques.

SUMMARY OF THE INVENTION

These and other problems and objections have been solved by using a matrix of vias excluding from the layer housing the power device to the layer using the power. In actual practice, 30, 40 or 50 vias penetrate the circuit board in its entirely all the way through the multiple layers. In essence, each via is a separate and distinct tunnel, thus, instead of having each via isolated so that it only contacts the top pad and the power plane, all of the vias are connected together at each layer by a power plane local to each level and then each local power plane is isolated cutting a path around it in a squared or donut shape.

The connection area on each layer is at least as large as the contact areas on the outer surfaces of the circuit board. The connection areas on certain layers may be larger, to increase heat dissipation or circuit capacitance, as desired. Using this concept, the power transfer has more metallized contact and allows less impedance and inductance than prior art arrangements.

In one embodiment, we have 100 amp power transfer at continuous operation. The vias are each interconnected on each of the layers through which they pass such that the current that flows along any particular via is free to either continue along that via or to move across the conductive surface of any layer to any other via, and move along that via to the desired plane. Outside of the via matrix area on each board lays the surface metallized layer which is interrupted so that the current is confined to within the via matrix area on each of the layers.

The vias are constructed utilize standard printed circuit board technology and FR4 material. Each via is a standard via, which is initially drilled through the fiberglass substrate, is then flashed with copper and finally plated with a tin lead plate.

A major technical advantage of our invention is that due to the several different vias that transmit power between the planes the total amount of power amperage that can be moved from one plane to another is dramatically increased over a single insert going through a single hole.

A further advantage of our system and method is that because of the matrix of vias, the effective surface areas that move the current between the planes is increased over any single channel.

A still further technical advantage of this invention is that the metal that goes into the via is compatible with the metal contacts of the power bricks thereby further reducing any dissimilarities due to the similar metals.

Another advantage of the present invention is that reliability is increased because: (1) the metallized surfaces on each layer improve the dimensional stability of the circuit board during fabrication and during use; (2) the multiple vias provide redundancy; (3) the use of a single electrical isolation around the entire matrix on certain layers improves circuit board yield during fabrication and improves reliability during use by reducing the possibility of electrical shorts; and (4) the metallized surfaces on each layer reduces temperature rise during use by improving heat transfer to the circuit board.

A still further technical advantage is that the construction of the via matrix consists of well-known manufacturing techniques.

A still further technical advantage of the invention is that the matrix via connection areas may optionally be extended outward from the matrix area on alternate layers, including the surface layers, to interdigitate with power or ground layers, as appropriate. This provides electrical capacitance with a high frequency response at the connection, thus reducing the electrical impedance of the connection (that is, it reduces the resistance to changes in the amount of current flowing through the connection). This additional capacitance may reduce the number or size of discrete capacitors which might otherwise be required by the assembly.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
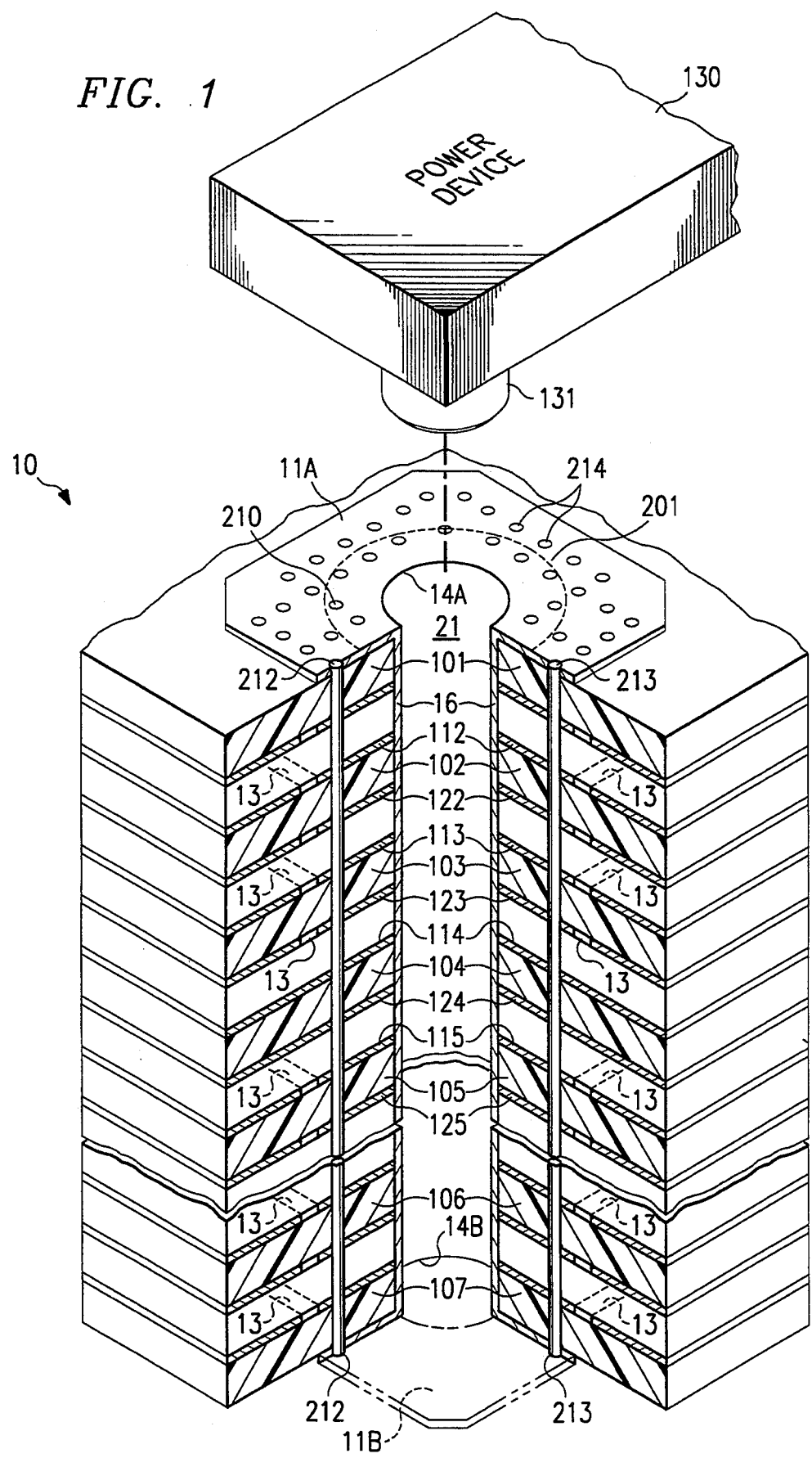
FIG. 1 shows a perspective cut-away view of a multilayer wiring board utilizing the inventive concept.

Turning now to FIG. 1, power device 130 is shown with one power contact 131 which, for 100 amps, would typically have a diameter of 0.185 inches.

Power contact 131 of power device 130 mates with channel (socket) 21 of multilayer printed wiring board 10. Device 130 typically includes a power transfer washer (not shown) which contacts with conductive surface 11A. The outline of contact is shown by broken line 201. Channel 21 is, in one embodiment, an electrically conductive material, such as tin/lead solder. In actual practice contact 131 need not make physical contact with sides 14A of channel 21, since power transfer occurs at the top surface. Printed wiring board 10 is shown with 7 layers, 101-107, each with a conductive material positioned on its upper and lower surface. The layers are shown separated by an air gap, but in reality there is insulation or other devices, constructed between layers. The view shown is for illustrative purposes only.

Figure 4:
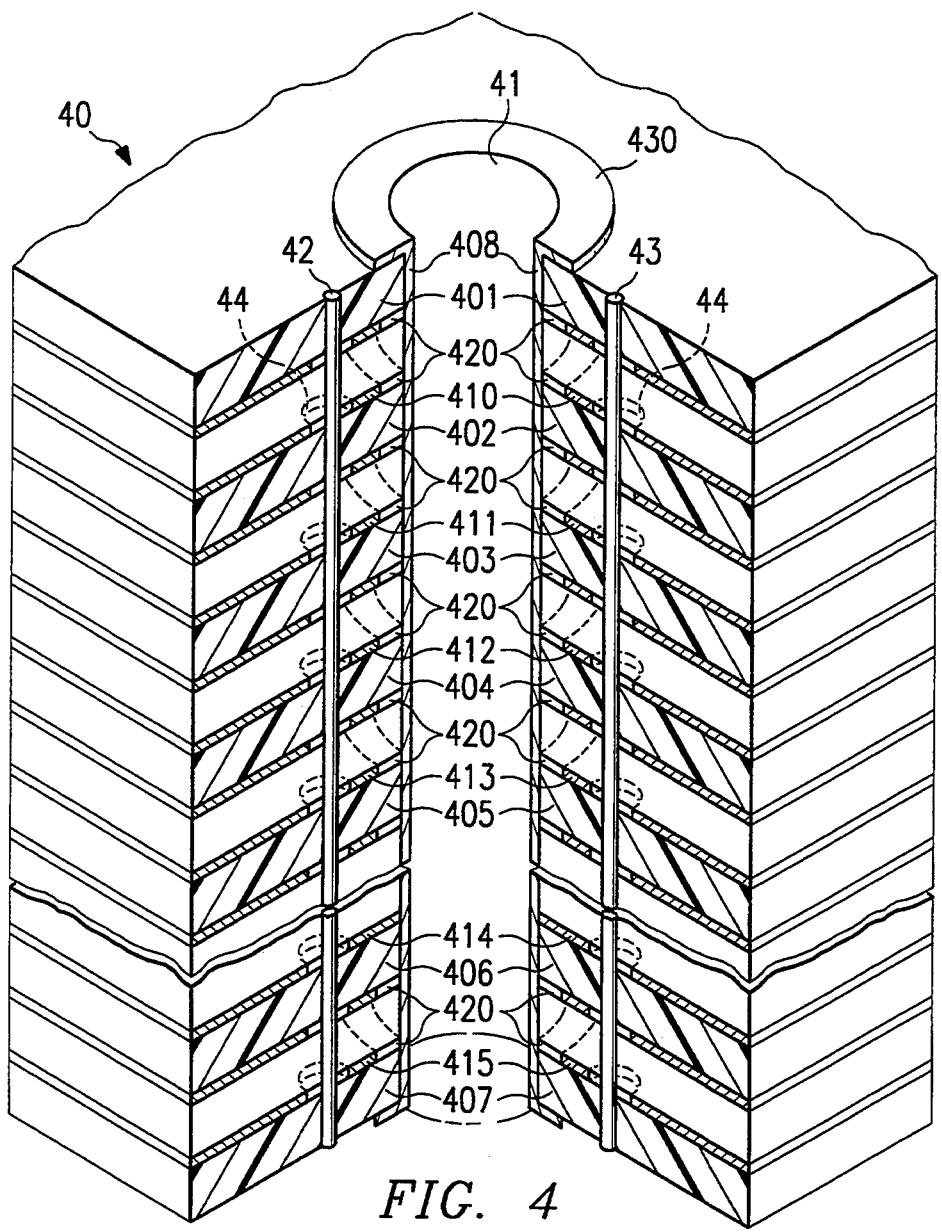
FIG. 4 shows a perspective cut-away view of a particular multilayer via system of the prior art.

Digressing momentarily and turning to FIG. 4, there is shown the prior art arrangement for power transfer from a device (not shown) plugged into channel 41. Assume that there is an electrically conductive surface, such as surface 411-415 on each layer 401-407, respectively. Also assume that it is desired to transfer power to or from layer 406 to plate 430, which in turn is mated to a power device, such as power device 130 of FIG. 1. The conductive layer 414 on layer 406 would make electrical contact with sides 408 of channel 41, while all of the other conductive layers would not make such electrical contact as shown by gap 420 on each layer (upper and lower surfaces) other than layer 406.

In the prior art if power was transmitted through vias 42 or 43, they would be connected electrically to surface 414 of layer 406, however, they would be insulated from all other layers. This insulation would be, for example, a wide hole through each layer. This is typical of the prior art and power transfer has been found to be limited to approximately 30 amps at 5 volts DC. While it is possible to make channel 41 larger and increase surface area to reach a transfer of 100 amps, the surface area would have to be increased dramatically and thereby encompass additional space on the board. Further, such expansion does not guarantee achieving 100 amp power transfer capability at 5 volts DC.

The prior art also uses a large single via extending from the top surface to the power level. The disadvantages of this arrangement are a) high current density which causes local heating and limits total current capacity; b) poor heat transfer to the board which aggravates local heating; c) no option for added capacitance; and d) no redundancy.

Another prior art system uses multiple matrix vias each passing through a large single clearance tunnel. The disadvantages of this arrangement are a) poor heat transfer to the board; b) no option for added capacitance; c) poor dimensional stability during fabrication and use of thick boards.

Still another prior art system uses multiple matrix vias each passing through clearance tunnels in all of the layers. The disadvantages of this arrangement are a) poor heat transfer to the board; b) no option for added capacitance; c) added risk of shorts during fabrication reduces yield; and d) risk of shorts during use creates a fire hazard.

Another prior art system uses multiple matrix vias with individual clearances using a machine-fitted insert. The disadvantages of this arrangement are a) added expense of the machined fitting (fabrication and assembly); b) poor heat transfer to the board; and c) no option for added capacitance.

Returning now to FIG. 1, and assume that the power layer which is to be connected to pin 131 is layer 104. Metallized surface 114 of layer 104 is electronically connected to wall 16 of channel 21.

As can be seen, the conductive (metallized) surfaces, such as surfaces 112, 113, 122, 123, of layers 102-103 are all connected electronically to wall 16 of channel 21, but they extend only to the circumferential periphery of via matrix 212 where gap 13 interrupts the conductivity on each layer except layer 104.

Channel 21 continues to, and makes electrical contact with, bottom surface 107. The purpose of washer 201 is to make electrical contact with a like surface (not shown) of power device 130, since the actual pin 131 is designed to fit inside column 21 without contact. The power is transferred between mating contacts 201 (one on device 130 and one on plate 11A) and is free to flow across conductive surface 11A to any via 210-214. Note that there can be many such vias shown as circles, wherein each via is in essence a tunnel. Power from washer 201 moves down the walls of channel 21 to metallized surface 11B of the bottom surface 107, and also moves to conductive surface 114 of layer 104.

In addition, a series of vias 210-214 are drilled from the top surface 11A through the bottom surface 11B. Each of these vias are plated with an electrically conductive plating which could be the same as on 11A and 11B so that the plating extends through all of the channels from the top surface to the bottom surface. In each of the layers the metallized portions, such as portions 112 and 122 of layer 102, contacts the metallized portion of the via. This occurs in every layer through the multilayer board. Also note that instead of plating, the vias could be solid rods of electronically conductive material.

At layer 104 the metallized surface 114 and perhaps metallized surface 124 on the bottom, extends outward across the entire plane in order for power to be distributed, as required, to components mounted on the board. At every other layer the metallized surface is interrupted outside of the matrix area of the vias, as is shown by gaps 13, so that the power cannot move any further than the outermost rim of the via matrix. This gap forms a circumference around a group of vias forming an outer boundary. Note that it is a designer's choice as to which surfaces shall continue beyond the gap, and it is not necessary for both the top and bottom surfaces of the same layer to be continuous.

In the embodiment shown in FIG. 1, current flows through via matrix 11A in the following manner. Current comes from power brick device 130 through metallized stud 131 that is 0.185 inches in diameter. The metallized stud 131 has a washer at the top (not shown) which conducts the current into top plate 11A to mating washer 201. Top plate 11A is electrically connected to all vias 210–214 in via matrix 11A and therefore allows the amperage to flow down all the vias, which could be solid or hollow, to all of the connected power planes until the current reaches its destination at power layer (plane) 104. This current also has the opportunity to flow down multiple vias 210–214 or it can flow down the side walls of channel 21, all of which are connected to layer 104. The current also flows all the way to bottom plate 11B and can then flow up through the vias to layer 104.

The current is capable of utilizing any or all of these paths, however, the current will take the path, or paths, of least resistance. This means that the current will basically spread across all of the vias and the walls of channel 21 thereby lowering the total resistance. Thus, the fact that there are many paths between power device 130 and layer 104 reduces the overall resistance in the path.

As a metallized surface becomes hotter (due to the high current flowing through it), it starts to take on more resistance. As the resistance increases, the current tends to seek a lower resistance path, thus switching across a layer, such as layer 122, to a different path or paths which are cooler.

One of the advantages of this invention is that as certain areas heat up, there are multiple paths, thus the current may alter its path and follow a path of less resistance. Therefore, the actual path through which the current flows changes from time to time as the different paths heat up. This path change is governed by the laws of physics, which dictates that the current flow through various ones of the many available paths which the current may take, from power device 130, as a function of least resistance.

Note that on any board there will exist several of these power via matrices which are utilized to move power, perhaps to the same layer, or to different layers as desired. Also note that while we have shown that only layer 104 is connected beyond the matrix area to the devices on that layer, several layers could be interconnected in such a fashion so that the power can actually be distributed to whichever layers are desired or to multiple layers. Also note that the power can be taken off at the top surface or at the bottom surface of each layer simply by extending the conductive layer of that layer beyond the matrix break area.

Continuing at FIG. 1, note that all of the layers are constructed either like layer 102 with a break 13 built into the metallized layer on the top and the bottom or like layer 104 where there is no break in metallized layer 114. Note that on layer 104 the bottom surface 124 is shown with a break 13 but this break can be eliminated if desired so that power distribution can occur on both the top and bottom surfaces. In a typical operation the power would only exist on one surface, such as surface 114.

Figure 2:
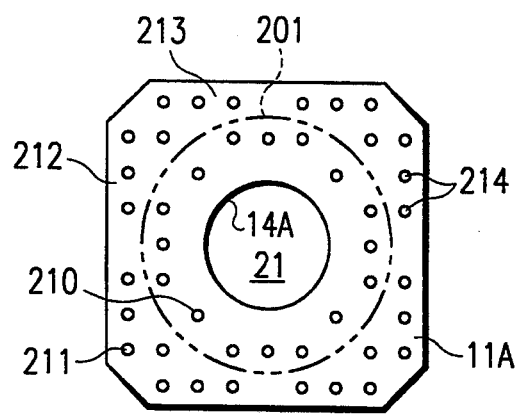
FIGS. 2 and 3 show top views of the surface area of alternate top plates where the vias are interconnected.

A top view of the via matrix is shown in FIG. 2 showing vias 210–214. This matrix area is approximately 0.44 inches by 0.44 inches, and contains approximately 44 vias. This pattern has been shown to be effective at 5 volts DC and 100 amps.

Figure 3:
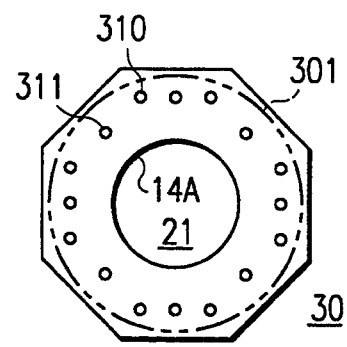

FIG. 3 shows an alternative configuration using fewer vias. For example, 16 vias having a total area of 0.4 inches by 0.4 inches. The actual pattern may be circular or it can be square or any other pattern desired. The design in FIG. 3 has been shown to transfer approximately 100 amps at about 50% more resistance. Our best results indicate that the resistance tends to be the lowest using the pattern of FIG. 2, the adding of additional vias has not shown to be effective to further reduce the resistance.

The effectiveness of a certain pattern depends upon (1) total number of layers, and (2) number of metallized layers to which contact is made. Also, the particular pattern of vias depends upon the diameter of washer 201. For a different thickness of circuit board or different number of connected layers, another pattern may be superior.

The increased area for current flow provided by the matrix vias results in decreased voltage drop (that is, lower electrical resistance) across the connection. This results in less power being wasted in the connection, and thus less heat created in the connection. This in turn reduces the operating temperature and increases the life of the connection, or conversely allows more power to be transferred through the connector for a given operating temperature.

As discussed above, the matrix via connection areas on each layer provide better thermal contact to the circuit board. Any heat generated in the connection is more easily conducted away through them and into the circuit board, reducing the operating temperature and increasing life still further for a given power level. The matrix via connection areas may optionally be extended outward on one or more layers, including the surfaces of the circuit board, to further increase the ability to dissipate heat from the connection. In addition, if one of the matrix vias should break at a point along their length, the connection areas on either side of the break will allow current to be shared by the remaining intact matrix vias. This redundancy increases manufacturing yield of the circuit board by tolerating errors in some of the matrix vias during fabrication, and improves reliability in use.

In actual practice an additional advantage is that the matrix via connection areas on each layer provide resistance to mechanical compression. The presence of the connection area metal preserves the thickness of each layer of the circuit board in the matrix via region and so makes the circuit board easier to fabricate than a circuit board without such connection area metal (that is, one with a single large clearance or metal-free area on each layer which wholly contains the matrix vias and isolates them one from another). The presence of the connection area metal on each layer also makes the circuit board more resistant to crushing in use, such as when installing a power device to the connection.

While the individual board connection areas are all shown as being cut at the periphery, they may optionally be extended outward on one or more layers, including the surfaces of the circuit board, to provide connections to other devices.

From a production standpoint, the entire connection is fabricated as part of the circuit board. This avoids the expense of fabricating and installing a separate contact as well as saving the space and weight of such a separate contact in the completed circuit board assembly.

Another advantage of the configuration of the invention is that the multiple current paths provided by the matrix vias provide less self-inductance than does a single path. The self-inductance is reduced because magnetic flux is partially cancelled between and near the matrix vias of a given connection.

Note also that while the conductive material of each level is shown on multiple surfaces of the layer, that material could be included within each layer or within selected layers.

Also, note that the attached power device as referred to herein need not be the actual power source in all applications. It may be instead a cable whose far end is attached to the actual power source.

Although the present invention and its advantages have been described in detail, it should be understood that various changes, substitutions and alterations can be made herein without departing from the spirit and scope of the invention as defined by the appended claims.

What is claimed is:

1. A multilayer device, each layer of which is capable of being electrically interconnected with other layers, said device comprising:
   at least one layer of electrically conductive material on certain of said device layers;
   a plurality of vias forming a via group having an outer boundary with all vias in said via group extending from an outside layer of said device through a plurality of other device layers, each via in said group electrically conductive and electrically connected to said electrically conductive material on selected ones of said plurality of other layers;
   wherein said electrically conductive material on selected ones of said layers is interrupted at said outer boundary of said via group; and
   wherein all of said vias in said via group are electrically interconnected at said outside layer.

2. A multilayer device, each layer of which is capable of being electrically interconnected with other layers, said device comprising:
   at least one layer of electrically conductive material on certain of said device layers;
   a plurality of vias forming a via group having an outer boundary with all vias in said via group extending from an outside layer of said device through a plurality of other device layers, each via in said group electrically conductive and electrically connected to said electrically conductive material on selected ones of said plurality of other layers; and
   wherein said electrically conductive material on selected ones of said layers is interrupted at said outer boundary of said via group; and all of said vias in said via group extend to a common layer, and all of said vias in said via group are electrically interconnected at said common layer.

3. A multilayer device, each layer of which is capable of being electrically interconnected with other layers, said device comprising:
   at least one layer of electrically conductive material on certain of said device layers;
   a plurality of vias forming a via group having an outer boundary with all vias in said via group extending from an outside layer of said device through a plurality of other device layers, each via in said group electrically conductive and electrically connected to said electrically conductive material on selected ones of said plurality of other layers;
   a channel positioned within said via group and extending through said device layers, said channel being electrically conductive and having a diameter for accepting a power terminal of a circuit device mounted to said multilayer device; and
   wherein said electrically conductive material on selected ones of said layers is interrupted at said outer boundary of said via group, and said channel is electrically connected to all of said vias in said via group at said outer layer.

4. A multilayer device, each layer of which is capable of being electrically interconnected with other layers, said device comprising:
   at least one layer of electrically conductive material on certain of said device layers;
   a plurality of vias forming a via group having an outer boundary with all vias in said via group extending from an outside layer of said device through a plurality of other device layers, each via in said group electrically conductive and electrically connected to said electrically conductive material on selected ones of said plurality of other layers;
   a channel positioned within said via group and extending through said device layers, said channel being electrically conductive and having a diameter for accepting a power terminal of a circuit device mounted to said multilayer device; and
   wherein said electrically conductive material on selected ones of said layers is interrupted at said outer boundary of said via group, and said channel is electrically connected to all of said vias in said via group at selected layers within said device.

5. A multilayer device, each layer of which is capable of being electrically interconnected with other layers, said device comprising:
   at least one layer of electrically conductive material on certain of said device layers;
   a plurality of vias forming a via group having an outer boundary with all vias in said via group extending from an outside layer of said device through a plurality of other device layers, each via in said group electrically conductive and electrically connected to said electrically conductive material on selected ones of said plurality of other layers;
   a channel positioned within said via group and extending through said device layers, said channel being electrically conductive and having a diameter for accepting a power terminal of a circuit device mounted to said multilayer device; and wherein said electrically conductive material on selected ones of said layers is interrupted at said outer boundary of said via group; said channel extends from said outside device layer to a common layer of said device, and all of said vias in said via group extend to said common layer and wherein all of said vias in said via group as well as said channel are electrically interconnected at said common layer.

6. The device as set forth in claim 5 wherein said common layer is another outside layer of said device.

7. The method of making a multilayer printed wiring device comprising the steps of:

constructing multiple device layers each having conductive material over portions of each said layer;

limiting the extent of said conductive material to a defined geometry on all but a selected number of said layers;

generating within said defined geometry a plurality of holes columnated with respect to said multiple device layers, such that a column of said holes pass through multiple layers; and coating the insides of said holes of each said column such that the holes in each column are electrically common and electrically connected to said conductive material at each said layer.

8. The method as set forth in claim 7 further comprising the step of:

creating at the center of said geometry a electrically conductive tube having a center portion for accepting a power lead from a device to be connected to said printed wiring device and said electrically conductive columnated holes at a plurality of layers.

9. A device for transferring power from a first layer of a multilayer circuit board to a second layer, said device comprising:

a primary current conducting channel having a first diameter;

a top plate attached to said primary channel adapted for mating electrically with said device;

a plurality of secondary current conducting channels, each having a second diameter, said secondary current conducting channels grouped in association with said primary current conducting channel;

a plurality of current conductive connections connecting each said secondary channel with all other secondary current conducting channels and with said primary current conducting channel and with said top plate;

the number of said connections being equal to the number of layers of said circuit board; and at least one of said current conductive connections adapted for distributing power at said second layer beyond the circumference of said group of secondary current conducting channels.

* * * * *